US009807877B1

United States Patent
Liu et al.

(10) Patent No.: US 9,807,877 B1
(45) Date of Patent: Oct. 31, 2017

(54) METHOD FOR MAKING A MULTILAYER FLEXIBLE PRINTED CIRCUIT BOARD

(71) Applicants: HongQiSheng Precision Electronics (QinHuangDao) Co., Ltd., Qinhuangdao (CN); FuKui Precision Component (Shenzhen) Co., Ltd., Shenzhen (CN)

(72) Inventors: Li-Kun Liu, Qinhuangdao (CN); Yan-Lu Li, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 15/285,593

(22) Filed: Oct. 5, 2016

(30) Foreign Application Priority Data

Jun. 7, 2016 (CN) .......................... 2016 1 0396582

(51) Int. Cl.
*H05K 3/20* (2006.01)
*H05K 1/02* (2006.01)
*H05K 1/11* (2006.01)
*H05K 3/06* (2006.01)
*H05K 3/40* (2006.01)
*H05K 3/46* (2006.01)

(52) U.S. Cl.
CPC ............. *H05K 1/028* (2013.01); *H05K 1/115* (2013.01); *H05K 3/06* (2013.01); *H05K 3/4038* (2013.01); *H05K 3/4611* (2013.01); *H05K 2201/09218* (2013.01); *Y10T 29/49128* (2015.01)

(58) Field of Classification Search
CPC ...... H05K 1/028; H05K 1/115; H05K 3/4038; H05K 3/4611; H05K 3/06; H05K 2201/09218; Y10T 29/49126; Y10T 29/49128; Y10T 29/49155; Y10T 29/49165
USPC .................... 29/830, 831, 846, 852; 174/254
See application file for complete search history.

(56) References Cited

U.S. PATENT DOCUMENTS

| | | | | |
|---|---|---|---|---|
| 4,687,695 A | * | 8/1987 | Hamby | H05K 3/4691 174/254 |
| 6,162,996 A | * | 12/2000 | Schmidt | H05K 1/028 174/254 |
| 8,188,372 B2 | * | 5/2012 | Sato | H05K 3/4691 29/846 |

* cited by examiner

*Primary Examiner* — Donghai D Nguyen
(74) *Attorney, Agent, or Firm* — Steven Reiss

(57) ABSTRACT

A flexible printed circuit board with multiple layers includes an inner wiring substrate and at least one outer wiring plate. Each outer wiring plate is connected to one surface of the inner wiring substrate, and defines at least one through hole which passes through the outer wiring plate to expose the inner wiring substrate. Each outer wiring plate further includes an adhesive plate connected to the inner wiring substrate. The adhesive plate includes a stepped portion extending towards a center of the through hole.

8 Claims, 3 Drawing Sheets

US 9,807,877 B1

METHOD FOR MAKING A MULTILAYER FLEXIBLE PRINTED CIRCUIT BOARD

FIELD

The subject matter herein generally relates to circuit boards, and particularly, to a multilayer flexible printed circuit board (FPCB) and a method for making a multilayer FPCB.

BACKGROUND

Multilayer circuit boards are widely used in various kinds of electronic devices. A multilayer circuit board usually comprises an inner conductive wiring layer and at least one outer conductive wiring layer. A fall structure is usually formed between the inner conductive wiring layer and the outer conductive wiring layer. When a dry film covers the outer conductive wiring layer, the dry film cannot fill a bottom of the fall structure. Thus, there is a need to increase the dry film thickness to allow the dry film to fully fill the bottom of the fall structure. However, such dry film may have a low resolution, and further limit a line width and a line space of the outer conductive wiring layer. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
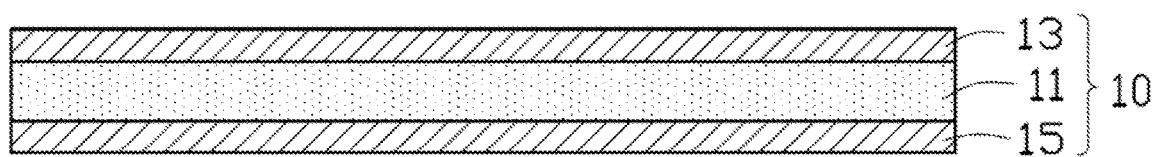
FIG. 1 is a diagrammatic view of an exemplary embodiment of a double-sided copper substrate according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIGS. 1-8, a method for making a multilayer FPCB 100 (shown in FIG. 8) is presented in accordance with an exemplary embodiment. The multilayer FPCB 100 can be applied to a rigid-flexible printed circuit board. The method for making the multilayer FPCB 100 is provided by way of example, as there are a variety of ways to carry out the method. The exemplary method can begin at step 1.

At step 1, referring to FIG. 1, a double-sided copper substrate 10 is provided which comprises a first isolated plate 11, and a first copper plate 13 and a second copper plate 15 connected to opposite surfaces of the first isolated plate 11.

In at least one exemplary embodiment, the first isolated plate 11 is made of a polymer selected from a group consisting of polyimide, polytetrafluoroethylene, poly thiamine, poly (methyl methacrylate), polycarbonate, polyethylene terephthalate, and polyimide-polyethyleneterephthalate, or any combination thereof. In at least one exemplary embodiment, the first isolated plate 11 is made of polyimide.

Figure 2:
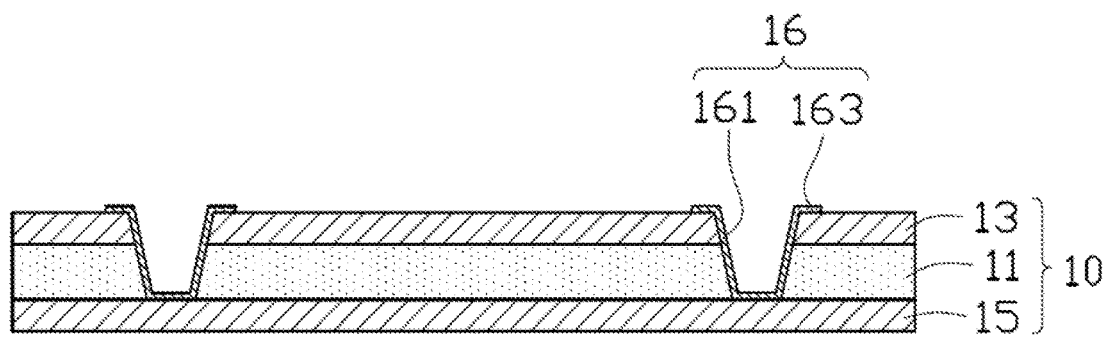
FIG. 2 is a diagrammatic view showing an electrically conductive hole being formed in the double-sided copper substrate of FIG. 1.

At step 2, referring to FIG. 2, at least one electrically conductive hole 16 is defined in the double-sided copper substrate 10 which electrically connects the first copper plate 13 to the second copper plate 15.

In at least one exemplary embodiment, step 2 can be carried out by defining the double-sided copper substrate 10 to form at least one connecting hole 161 which passes through the first copper plate 13 and the second copper plate 15. Each connecting hole 161 is metalized to form a copper layer 163 on an inner wall of the connecting hole 161, thus forming the electrically conductive hole 16.

Figure 3:
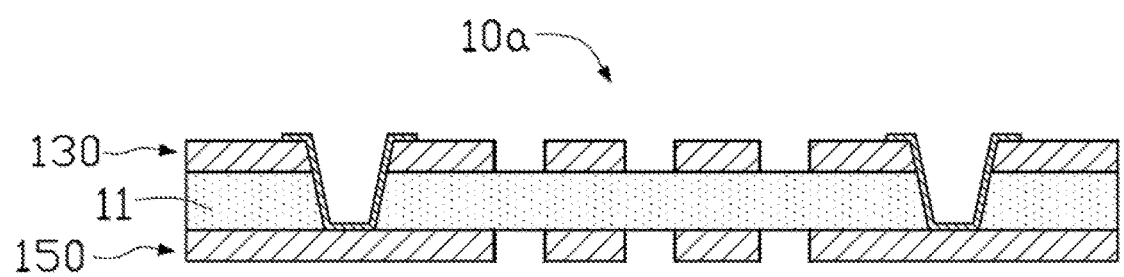
FIG. 3 is a diagrammatic view showing the double-sided copper substrate of FIG. 2 being etched to form an inner wiring substrate.

At step 3, referring to FIG. 3, the first copper plate 13 and the second copper plate 15 are etched to respectively form a first inner conductive wiring layer 130 and a second inner conductive wiring layer 150, thereby forming an inner wiring substrate 10a.

Figure 4:
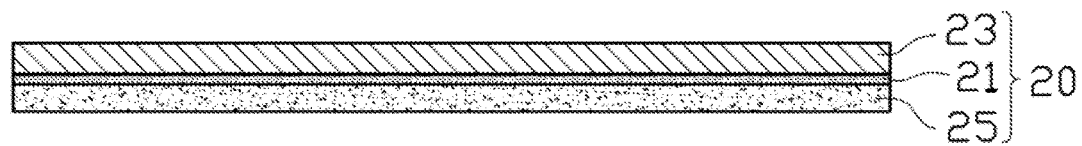
FIG. 4 is a diagrammatic view of a single-sided copper substrate.

At step 4, referring to FIG. 4, two single-sided copper substrates 20 are provided, each comprising a second isolated plate 21, and a third copper plate 23 and an adhesive plate 25 connected to opposite surfaces of the single-sided copper substrate 20. In at least one exemplary embodiment, the adhesive plate 25 has a thickness of about 10 micrometers to about 25 micrometers.

In at least one exemplary embodiment, the second isolated plate 21 is made of a polymer selected from a group consisting of polyimide, polytetrafluoroethylene, poly thiamine, poly (methyl methacrylate), polycarbonate, polyethylene terephthalate, and polyimide-polyethyleneterephthalate, or any combination thereof. The second isolated plate 21 has a thickness of about 3 micrometers to about 10 micrometers.

Figure 5:
FIG. 5 is a diagrammatic view showing the single-sided copper substrate of FIG. 4 being punched to form a through hole.

At step 5, referring to FIG. 5, each single-sided copper substrate 20 is punched to form at least one through hole 201 which passes through the third copper plate 23, the second isolated plate 21, and the adhesive plate 25.

Figure 6:
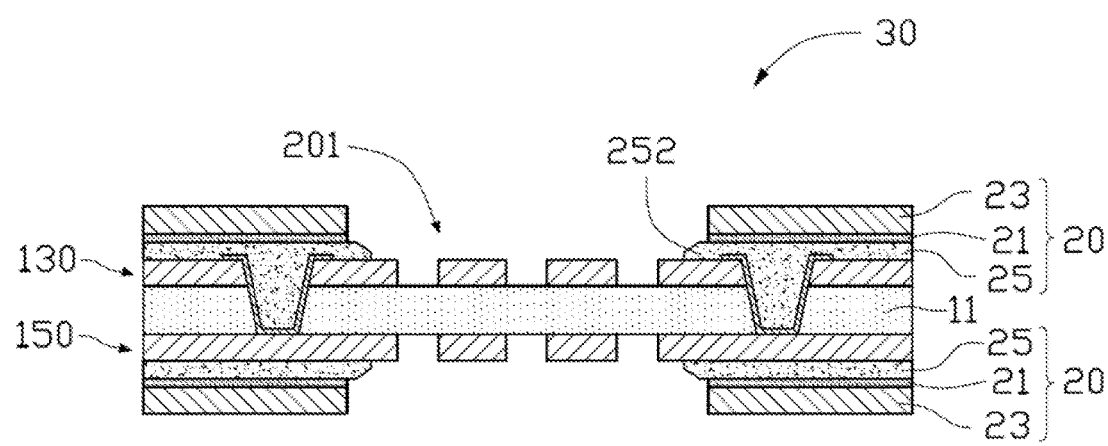
FIG. 6 is a diagrammatic view showing the single-sided copper substrate of FIG. 5 and the inner wiring substrate of FIG. 3 being pressed to form an intermediate product.

At step 6, referring to FIG. 6, the two single-sided copper substrates 20 punched in FIG. 5 is attached onto opposite surfaces of the inner wiring substrate 10a of FIG. 3 to expose the first inner conductive wiring layer 130 and the second inner conductive wiring layer 150 through the through hole 201. The adhesive plates 25 of the two single-sided copper substrates 20 are connected to the first inner conductive wiring layer 130 and the second inner conductive wiring layer 150. Then, the two single-sided copper substrates 20 are heated and pressed together to cause adhesive of the adhesive plates 25 to flow and fill each electrically conductive hole 16. The adhesive further extends towards a center of the through hole 201 along a direction substantially perpendicular to a center axis of the electrically conductive hole 16 to form a stepped portion 252, thereby forming an intermediate product 30. In at least one exemplary embodiment, the stepped portion 252 extends towards the center of the through hole 201 by a distance of about 2 millimeters to about 5 millimeters. The distance of the stepped portion 252 extending towards the center of the through hole 201 can be varied by adjusting a temperature for heating and a pressure for pressing the two single-sided copper substrates 20 together.

In at least one exemplary embodiment, the through holes 201 of one single-sided copper substrate 20 correspond to the through holes 201 of the other single-sided copper substrate 20.

Figure 7:
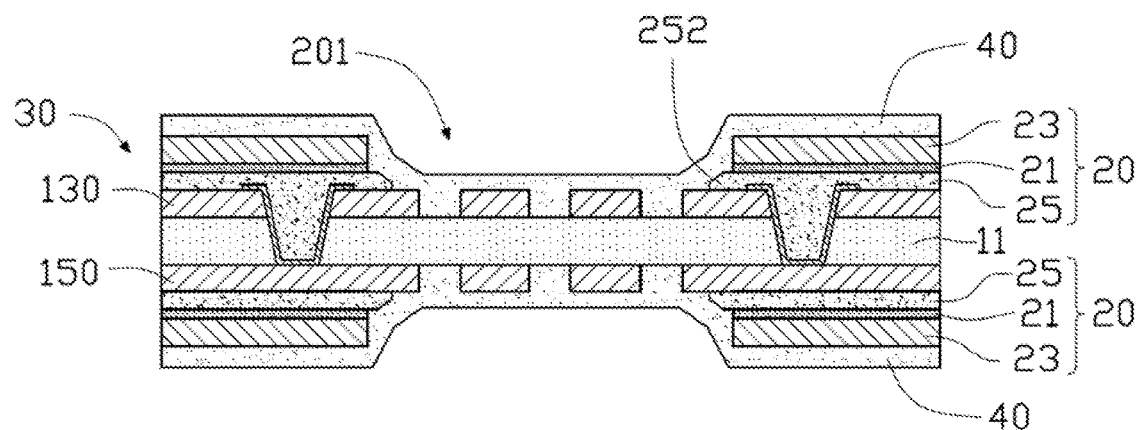
FIG. 7 is a diagrammatic view showing a dry film covering the intermediate product of FIG. 6.

At step 7, referring to FIG. 7, cover the two third copper plates 23, the exposed first inner conductive wiring layer 130, and the exposed second inner conductive wiring layer 150 of the intermediate product 30 with two dry film 40. The dry films 40 are pressed together and fill gaps formed by the exposed first inner conductive wiring layer 130, and the exposed second inner conductive wiring layer 150, thereby connecting the dry films 40 to the intermediate product 30.

Since a height of the fall structure formed between the third copper plates 23 and the exposed first inner conductive wiring layer 130 or the second inner conductive wiring layer 150 can be decreased by the stepped portions 252, the dry films 40 can fully fill the bottom of the fall structure, thus enabling a complete and reliable connection between the dry films 40 and the intermediate product 30.

In at least one exemplary embodiment, the dry film 40 has a thickness of about 15 micrometers.

Figure 8:
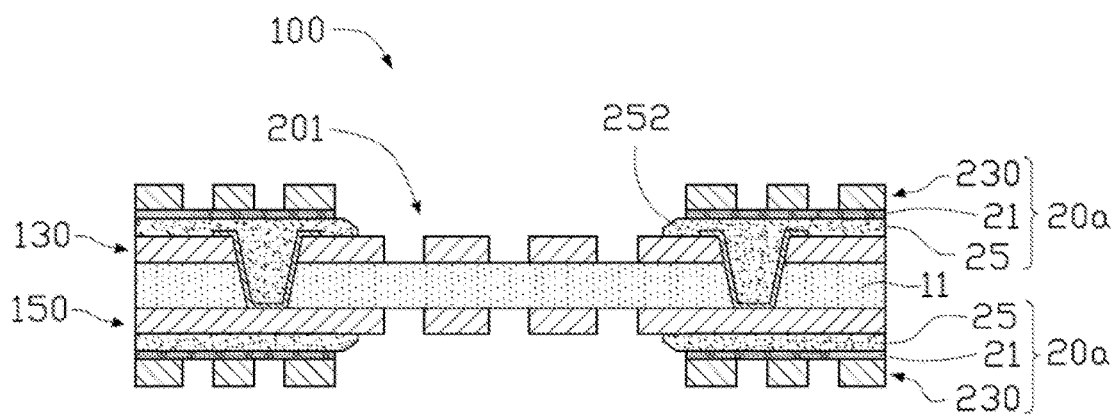
FIG. 8 is a diagrammatic view showing an outer conductive wiring layer being formed on the intermediate product of FIG. 7, to form a multilayer FPCB.

At step 8, referring to FIG. 8, each third copper plate 23 is etched through the dry film 40 to form an outer conductive wiring layer 230. The dry films 40 are then removed, thereby forming two outer wiring plates 20a each comprising the outer conductive wiring layer 230, the corresponding second isolated plate 21, and the corresponding adhesive plate 25.

The stepped portions 252 can further prevent a short circuit from being formed between the outer wiring plates 20a and the inner wiring substrate 10a. The above method does not require a dry film 40 with a greater thickness, the multilayer FPCB 100 with minimum possible line width and line space can be formed.

In other exemplary embodiments, only one single-sided copper substrate 20 is provided at step 4, and the single-sided copper substrate 20 is formed on the first inner conductive wiring layer 130 or the second inner conductive wiring layer 150 at step 6. In this case, the double-sided copper substrate 10 provided at step 1 can be replaced by a single-sided copper substrate in which only one inner conductive wiring layer is formed.

In other exemplary embodiments, after step 8, steps 4 to 8 are repeated to form a multilayer FPCB 100 having more than one outer wiring plate 20a.

FIG. 8 illustrates that the multilayer FPCB 100 comprises an inner wiring substrate 10a and two outer wiring plates 20a connected to opposite surfaces of the inner wiring substrate 10a. Each outer wiring plate 20a defines at least one through hole 201 which passes through the outer wiring plates 20a to expose the inner wiring substrate 10a. Each outer wiring plate 20a comprises an adhesive plate 25 connected to the inner wiring substrate 10a. The adhesive plate 25 comprises a stepped portion 252 extending towards a center of the through hole 201.

The inner wiring substrate 10a comprises a first isolated plate 11, and a first inner conductive wiring layer 130 and a second inner conductive wiring layer 150 connected to opposite surfaces of the first isolated plate 11. Two adhesive plates 25 are connected to a surface of the first inner conductive wiring layer 130 facing away from the first isolated plate 11 and a surface of the second inner conductive wiring layer 150 facing away from the first isolated plate 11.

At least one electrically conductive hole 16 is defined in the inner wiring substrate 10a which electrically connects the first inner conductive wiring layer 130 to the second inner conductive wiring layer 150. In at least one exemplary embodiment, each electrically conductive hole 16 comprises a connecting hole 161 which passes through the first isolated plate 11 and the first inner conductive wiring layer 130, and a copper layer 163 formed on an inner wall of the connecting hole 161.

Each outer wiring plate 20a further comprises a second isolated plate 21 and an outer conductive wiring layer 230 connected to the second isolated plate 21. Each adhesive plate 25 is connected to a surface of the second isolated plate 21 facing away from the corresponding outer conductive wiring layer 230.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for making a multilayer flexible printed circuit board comprising:

providing an inner wiring substrate and at least one single-sided copper substrate, each single-sided copper substrate comprising an adhesive plate;

defining at least one through hole in each single-sided copper substrate;

forming an intermediate product by attaching the adhesive plate of each single-sided copper substrate onto one surface of the inner wiring substrate to expose the inner wiring substrate through the through hole, and heating and pressing the single-sided copper substrate together to cause the adhesive of the adhesive plate to extend towards a center of the through hole along a direction substantially perpendicular to a center axis of the electrically conductive hole to form a stepped portion;

covering each single-sided copper substrate of the intermediate product with a dry film, wherein the dry film is further formed over exposed inner wiring substrate, and then pressing the dry film to cause the dry film to fill gaps formed by the exposed inner wiring substrate; and forming an outer wiring plate by etching each single-sided copper substrate of the intermediate product, and removing the dry film to form the multilayer flexible printed circuit board.

2. The method of claim 1, wherein the step of "providing an inner wiring substrate" comprises:

provides a double-sided copper substrate which comprises a first isolated plate with two opposite surfaces, wherein a first copper plate and a second copper plate are connected to the two opposite surfaces of the first isolated plate;

defining at least one electrically conductive hole in the double-sided cooper substrate, thus electrically connecting the first copper plate to the second copper plate of the double-sided copper substrate using the at least one electrically conductive hole; and forming the inner wiring substrate by etching the first copper plate and the second copper plate to respectively form a first inner conductive wiring layer and a second inner conductive wiring layer.

3. The method of claim 2, wherein the step of defining at least one electrically conductive hole in the double-sided copper substrate further comprises:

defining the double-sided copper substrate to form at least one connecting hole which passes through the first copper plate and the second copper plate; and metalizing each connecting hole to form a copper layer on an inner wall of the connecting hole to form the at least one electrically conductive hole.

4. The method of claim 2, wherein two single-sided copper substrates are provided, each single-sided copper substrate comprises a second isolated plate, a third copper plate, and an adhesive plate, wherein the third copper plate and the adhesive plate are connected to the two opposite surfaces of the single-sided copper substrate, wherein each through hole of the two single-side copper substrates passes through the third copper plate, the second isolated plate, and the adhesive plate, and wherein the two adhesive plates of the two single-sided copper substrates are connected to the first inner conductive wiring layer and the second inner conductive wiring layer, and wherein both third copper plates of the two single-sided copper substrates are etched through the dry films to form two outer conductive wiring layers, thereby forming two outer wiring plates each comprising the outer conductive wiring layer, the corresponding second isolated plate, and the corresponding adhesive plate.

5. The method of claim 4, wherein the adhesive plate has a thickness of about 10 micrometers to about 25 micrometers.

6. The method of claim 4, wherein the second isolated plate has a thickness of about 3 micrometers to about 10 micrometers.

7. The method of claim 1, wherein the stepped portion extends towards the center of the through hole by a distance of about 2 millimeters to about 5 millimeters.

8. The method of claim 1, wherein the dry film has a thickness of about 15 micrometers.

* * * * *